United States Patent [19]

Kakuda et al.

[11] Patent Number: 5,162,933
[45] Date of Patent: Nov. 10, 1992

[54] ACTIVE MATRIX STRUCTURE FOR LIQUID CRYSTAL DISPLAY ELEMENTS WHEREIN EACH OF THE GATE/DATA LINES INCLUDES AT LEAST A MOLYBDENUM-BASE ALLOY LAYER CONTAINING 0.5 TO 10 WT. % OF CHROMIUM

[75] Inventors: Nobuhiko Kakuda; Tsutomu Wada, Fuchu; Kinya Kato, Iruma; Tadamichi Kawada, Urawa; Masamichi Okamura, Tokorozawa; Shigeo Aoki; Yasuhiro Ukai, both of Kobe; Kiyoshi Taruta, Matsubara; Tomihisa Sunata, Miki; Hiroshi Saito; Takanobu Nakagawa, both of Kobe, all of Japan

[73] Assignees: Nippon Telegraph and Telephone Corporation, Tokyo; Hosiden Corporation, Osaka, both of Japan

[21] Appl. No.: 697,991

[22] Filed: May 10, 1991

[30] Foreign Application Priority Data

| May 16, 1990 | [JP] | Japan | 2-124075 |
| May 16, 1990 | [JP] | Japan | 2-124076 |
| May 16, 1990 | [JP] | Japan | 2-124080 |
| May 16, 1990 | [JP] | Japan | 2-124081 |

[51] Int. Cl.[5] .................. G02F 1/13; H01L 27/12
[52] U.S. Cl. .................. 359/59; 359/67; 359/87; 257/59
[58] Field of Search ............ 359/59, 87, 4, 23.7, 359/62

[56] References Cited

U.S. PATENT DOCUMENTS

| 4,770,498 | 9/1988 | Aoki et al. | 359/59 |
| 4,810,060 | 3/1989 | Ukai | 359/59 |
| 4,821,092 | 4/1989 | Noguchi | 359/59 |
| 4,853,296 | 8/1989 | Fukuyoshi | 359/87 |
| 4,869,576 | 9/1989 | Aoki et al. | 359/59 |
| 4,906,072 | 3/1990 | Kaneko et al. | 359/87 |
| 4,948,231 | 8/1990 | Aoki et al. | 359/59 |

*Primary Examiner*—William L. Sikes
*Assistant Examiner*—Huy K. Mai
*Attorney, Agent, or Firm*—Pollock, Vande Sande and Priddy

[57] ABSTRACT

In an active matrix structure for liquid crystal display elements which includes pixel electrodes arranged in a matrix form on a glass base plate, thin film transistors having their drains connected to the pixel electrodes, respectively, data lines each connected to sources of the thin film transistors of one column and gate lines connected to gates of the thin film transistors of one row, there are provided in the same plane a light blocking layer disposed opposite each of the thin film transistors across an insulating layer, a storage capacitance electrode disposed partly opposite each of the pixel electrodes across the insulating layer and storage capacitance lines for interconnecting the capacitance electrodes. The light blocking layers, the storage capacitance electrodes and the storage capacitance lines are formed of the same material and at the same time.

20 Claims, 6 Drawing Sheets

ACTIVE MATRIX STRUCTURE FOR LIQUID CRYSTAL DISPLAY ELEMENTS WHEREIN EACH OF THE GATE/DATA LINES INCLUDES AT LEAST A MOLYBDENUM-BASE ALLOY LAYER CONTAINING 0.5 TO 10 WT. % OF CHROMIUM

BACKGROUND OF THE INVENTION

The present invention relates to an active matrix structure for a liquid crystal display which is employed in a flat display, for instance.

At present, display devices of the type employing liquid crystal point to a TV, a graphic display, etc. and are being developed rapidly for practical use. Above all, a liquid crystal display device of an active matrix structure having a switching element connected to each pixel is free from crosstalk and excellent in contrast, and hence is now being put into practical use as the most promising high picture quality flat display. Such a liquid crystal display device having the active matrix structure usually employs a thin film transistor as the switching element for each pixel.

Figure 1:
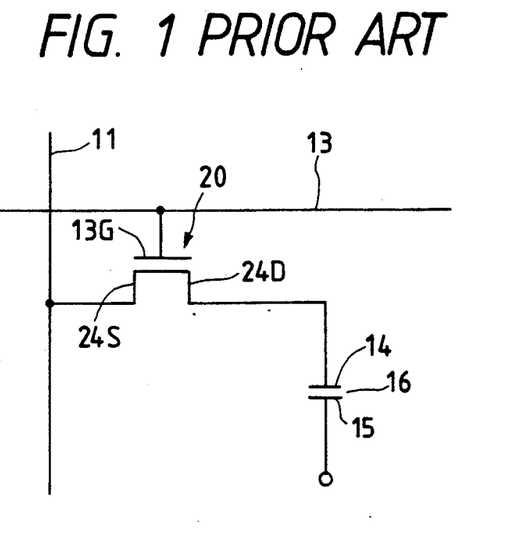
FIG. 1 is a schematic diagram for explaining a conventional active matrix structure.

FIG. 1 is a diagram showing an equivalent circuit of each pixel in a conventional liquid crystal display device having the active matrix structure. Reference numeral 11 indicates a data line, 13 a gate line, 20 a thin film transistor (TFT), and 24S the source of the thin film transistor 20, the source 24S being connected to the data line 11. Reference numeral 24D denotes the drain of the thin film transistor 20 and 13G the gate of the thin film transistor 20, the gate 13G being connected to the gate bus 13. Reference numeral 14 represents a transparent pixel electrode connected to the drain 24D, 15 a transparent common electrode formed on one of two opposed base plates (not shown) with a liquid crystal layer sandwiched therebetween, and 16 a pixel capacitance formed by the transparent pixel electrode 14 and the transparent common electrode 15.

In the liquid crystal display device of the active matrix structure, when the thin film transistor 20 is turned ON by applying a row select signal to the gate line 13, the pixel capacitance 16 is charged by a drive voltage which is applied to the data line 11 corresponding to an image signal, and the potential of the pixel capacitance 16 relative to the common electrode 15 is controlled. In other words, a voltage corresponding to the image signal is written into the pixel capacitance 16. Then, when the thin film transistor 20 is turned OFF, the voltage written in the pixel capacitance 16 is retained and stored. This mechanism is the same as that of a semiconductor memory DRAM. That is to say, the DRAM uses each capacitor as a storage element for writing therein and reading thereout information, whereas the liquid crystal display device uses the voltage of the pixel capacitance 16 to effect a molecular orientation of the liquid crystal forming a dielectric of the pixel capacitance 16 and the retention of the molecular orientation. As a result of this, the quantity of light passing through the pixel capacitance 16 is controlled, by which the function of a display element is performed.

In practice, however, the voltage written in the pixel capacitance 16 decreases owing to various leakage currents. For example, amorphous silicon used for the thin film transistor 20 is so high in photoconductivity as to be employed for a photosensor, and when the thin film transistor 20 is exposed to light, a leakage current between the source 24S and the drain 24D materially increases. On the other hand, since the conductivity of the liquid crystal itself is greatly temperature-dependent, a temperature rise significantly impairs its insulation, causing a self-discharge of the liquid crystal capacitance 16. At the same time, the leakage current of the thin film transistor 20 also increases with the temperature rise. Thus, the voltage of the pixel capacitance 16 decreases owing to such various leakage currents and the retention of the orientation of the liquid crystal becomes unstable accordingly—this is perceived as a decrease in the contrast of a display or a flicker, incurring degradation of the display quality.

Figure 2:
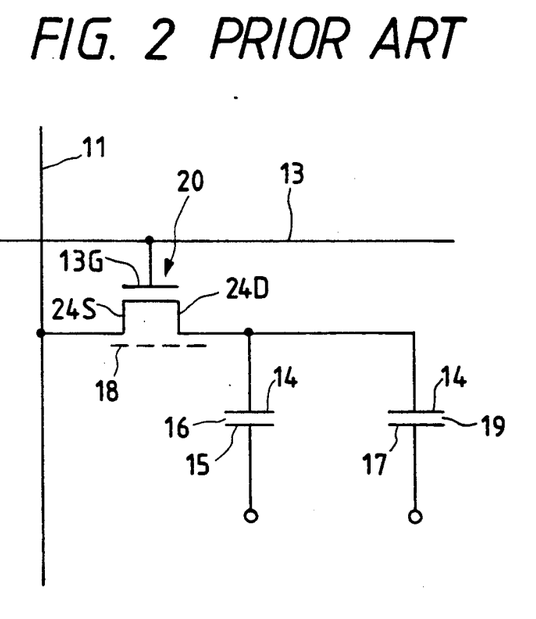
FIG. 2 is a schematic diagram for explaining another conventional active matrix structure provided with a signal storage capacitance.

To avoid this, it is a common practice to take such a measure as shown in FIG. 2. In FIG. 2, reference numeral 18 denotes a light blocking layer for blocking light incident to the thin film transistor 20. The light blocking layer 18 is formed of an opaque metal. When the thin film 20 is of an inversely staggered structure, the light blocking layer 18 is provided on the liquid crystal side, whereas when the thin film transistor 20 is of a staggered structure, the light blocking layer 18 is provided on the base plate with an insulating film sandwiched therebetween. Reference numeral 17 indicates a storage capacitance electrode disposed opposite the transparent pixel electrode 14. The storage capacitance electrode 17 is connected to a storage capacitance line dedicated thereto or to the gate line 13 of the preceding stage. Reference numeral 19 denotes a signal storage capacitance formed by the transparent pixel electrode 14 and the storage capacitance electrode 17. A dielectric of the signal storage capacitance 19 is formed by a silicon oxide film, silicon nitride film, or similar stable insulating film which has an excellent insulating property.

The liquid crystal display device of such an active matrix structure includes the light blocking layer 18 as mentioned above, and hence affords substantial reduction of the leakage current which results from the incidence of light to the thin film transistor 20. Furthermore, since the signal storage capacitance 19 is provided in parallel to the pixel capacitance 16, the amount of charge stored in the total capacitance can be greatly increased, and consequently, even if the self-discharge of the pixel capacitance 16 and the leakage current of the thin film transistor 20 increase owing to a temperature rise or the like, the voltage variation of the pixel capacitance 16 can be held within a given limit. Thus, the stability of orientation of the liquid crystal increases and a decrease in the contrast of a display can be avoided.

Since such a liquid crystal display device includes the light blocking layer 18 and the signal storage capacitance 19, however, the number of its manufacturing steps increases and the manufacturing cost rises accordingly. For instance, the formation of the light blocking layer 18 calls for the steps of depositing metal, patterning it and depositing an insulating film. When the storage capacitance electrode 17 is connected to the gate line 13 of the preceding stage, there is no need of providing a dedicated storage capacitance line, and consequently, the number of manufacturing steps does not increase, but the load on the gate line 13 increases so much that it is difficult to apply the liquid crystal display device to a large display, and at the same time, the necessity of sequential scanning imposes severe limitations on the drive system used. On the other hand, when the storage capacitance electrode 17 is connected to the storage capacitance line, the load on the gate line 13 is so small that the liquid crystal display device can be applied to a large display, but the formation of the storage capacitance line increases the number of manufacturing steps and hence raises the manufacturing costs.

SUMMARY OF THE INVENTION

It is therefore an object of the present invention to provide an active matrix structure which does not appreciably deteriorate the display image quality and is low in manufacturing costs.

To attain the above objective, according to the present invention, at least light blocking layers for blocking light incident to thin film transistors, and storage capacitance electrodes opposite transparent pixel electrodes and storage capacitance lines to which the storage capacitance electrodes are connected are formed by the same layer of the same material on a glass base plate, each of the thin film transistors is formed so that it overlaps the light blocking layer through an insulating film, and the transparent pixel electrode is formed in a manner to overlap the storage capacitance electrode through the insulating film.

With such an active matrix structure, the provision of the light blocking layer permits substantial reduction of the leakage current resulting from the incidence of light to the thin film transistor, and the provision of the storage capacitance electrode allows a substantial increase in the amount of charge to be stored in the pixel capacitance. Moreover, since the light blocking layers, the storage capacitance electrodes and the storage capacitance lines are formed by the same layer of the same material, an increase in the number of manufacturing steps is held minimum.

DESCRIPTION OF THE PREFERRED EMBODIMENTS

Figure 3:
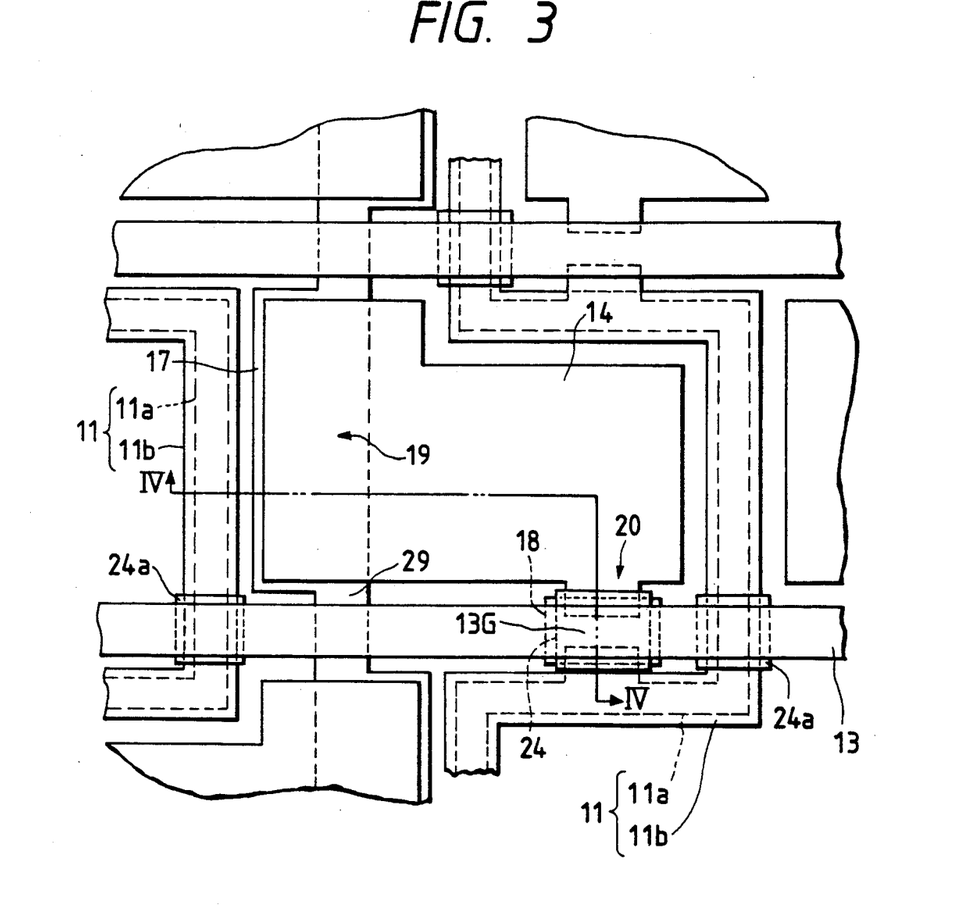
FIG. 3 is a plan view illustrating the vicinity of one pixel in the active matrix structure according to the present invention.
Figure 4:
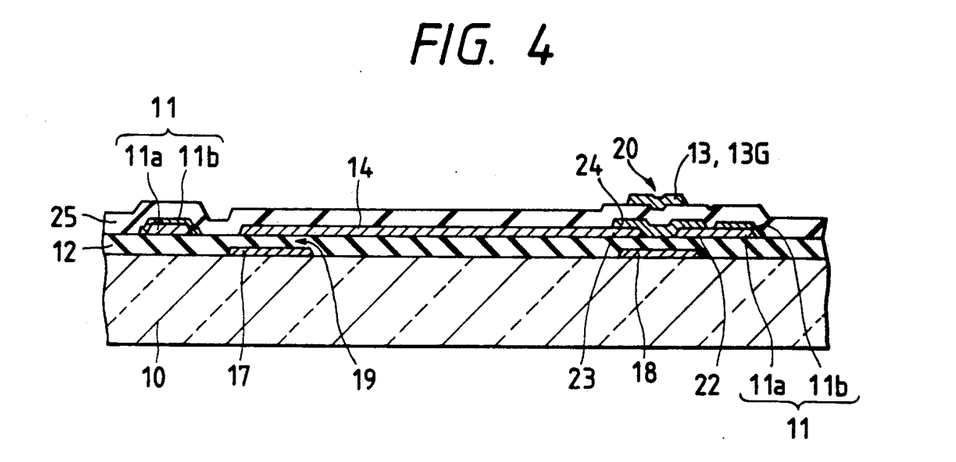
FIG. 4 is a sectional view taken on the line IV—IV in FIG. 3.

FIG. 3 is a plan view showing one pixel and its vicinity in the active matrix structure according to the present invention, and FIG. 4 is a sectional view taken on the line IV—IV in FIG. 3, wherein each thin film transistor is of a staggered form. In FIGS. 3 and 4, reference numeral 10 designates a glass base plate and 29 designates a storage capacitance line to which a storage capacitance electrode 17 is connected. On the glass base plate 10 light blocking layers 18, storage capacitance electrodes 17 and storage capacitance lines 29 extending in the row direction are formed by the same layer of the same material, for example, an aluminum layer 100 nm thick. Reference numeral 12 denotes an insulating layer deposited almost all over the base plate 10, covering the light blocking layers 18, the storage capacitance electrodes 17 and the storage capacitance lines 19. The insulating layer 12 is formed by, for instance, a silicon nitride film. The storage capacitance electrodes 17 are disposed opposite the corresponding transparent pixel electrodes 14 across the insulating layer 12, forming signal storage capacitances 19. The pixel electrode 14 is formed of indium-tin-oxide (ITO). The capacitance of the signal storage capacitance 19 per unit area is determined by the material and thickness of the insulating layer 12. On the other hand, the light blocking layer 18 underlies the thin film transistor 20 and a parasitic capacitance between a source electrode 22 and a drain electrode 23, which poses a problem in terms of driving, is also determined by the material and thickness of the insulating layer 12; therefore, the thickness of the insulating layer 12 must be selected to be a suitable value. In this embodiment the insulating layer 12 is, for example, 500 nm in thickness.

In this embodiment each data line 11 comprises an ITO layer 11a formed on the insulating layer 12 and a molybdenum-base alloy layer 11b covering the ITO layer 11a, and the ITO layer 11a is formed simultaneously with the formation of the pixel electrode 14. The ITO layer 11a of the data line 11 and the pixel electrode 14 are extended toward each other and their opposed marginal portions form the source and drain electrodes 22 and 23, respectively. An amorphous silicon semiconductor layer 24 bridges across a gap between the source and drain electrodes 22 and 23. Almost all over the base plate 10 there is coated a gate insulating film 25 common to all the thin film transistors 20, covering the data lines 11, the pixel electrodes 14 and the semiconductor layers 24. The gate insulating film 25 is formed by a 300 nm thick silicon nitride film, on which there is formed a gate line 13 extending over the semiconductor layers 24 of each row, and a portion of the gate line 13 overlapping each semiconductor layer 24 constitutes a gate electrode 13G. In this embodiment, a semiconductor layer 24a is also formed over the data line 11 at each intersection of the data line 11 and the gate line 13 at the same time as the semiconductor layer 24 of the thin film transistors (hereinafter referred to as the TFT) 20 are formed. The semiconductor layer 24a increases, in cooperation with the gate insulating film 25, the reliability of insulation between the data line 11 and the gate line 13 at their intersection.

Figure 5:
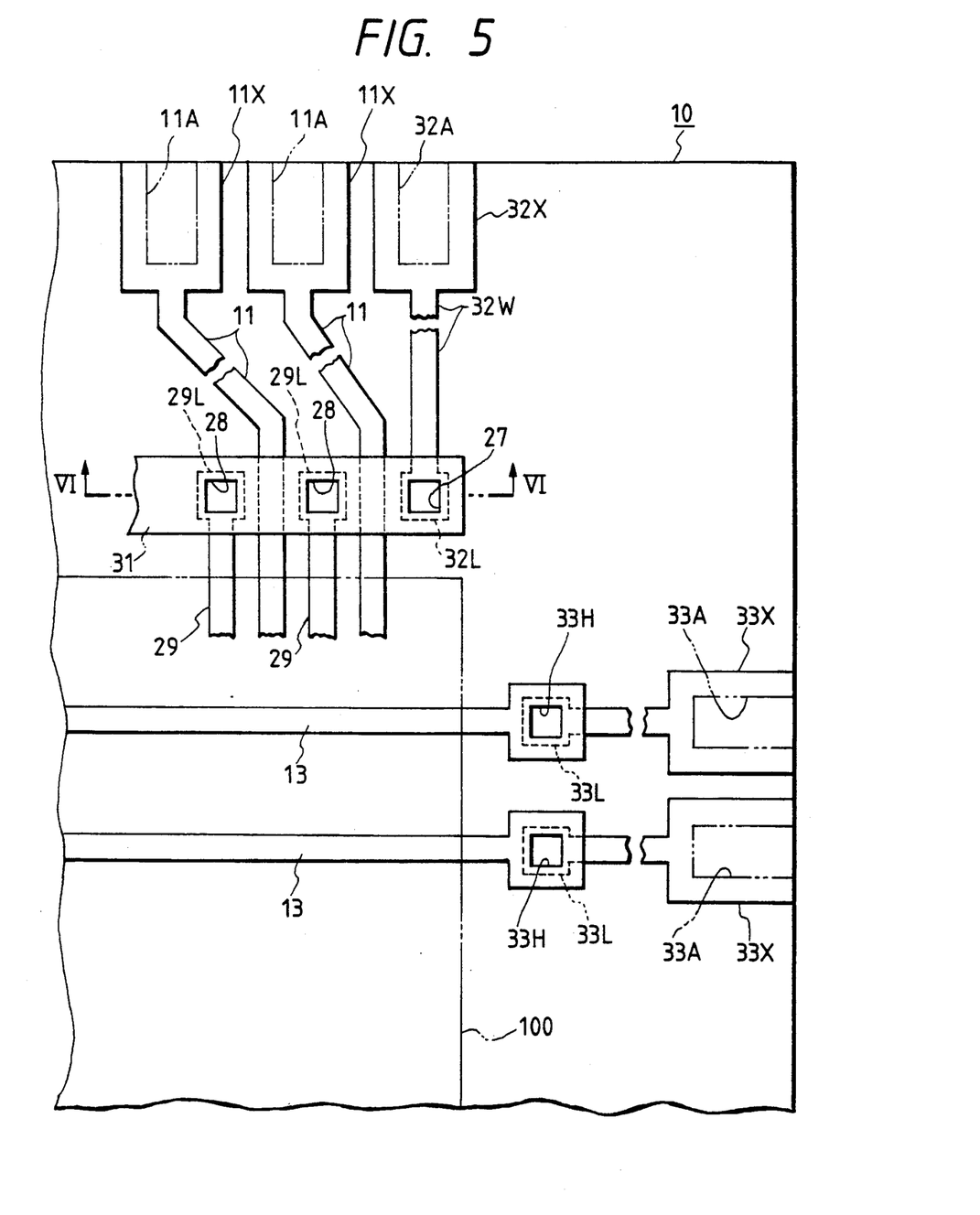
FIG. 5 is a plan view showing a portion of the peripheral terminal area of the active matrix structure according to the present invention.
Figure 6:
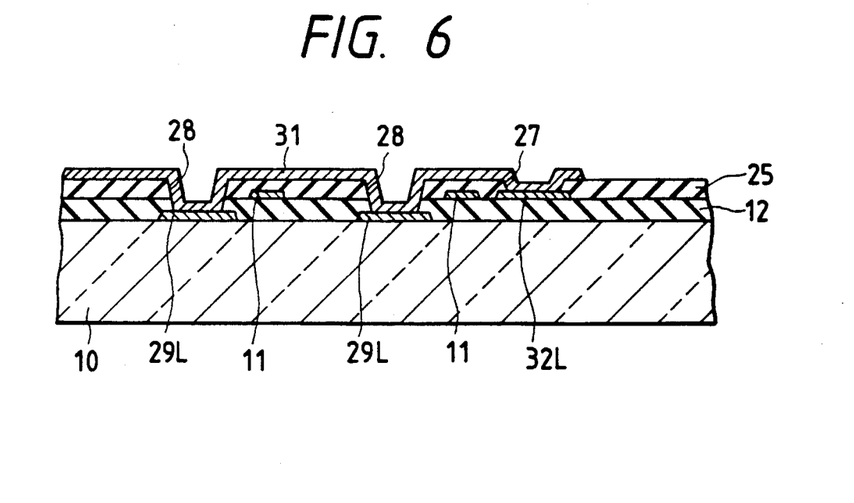
FIG. 6 is a sectional view taken on the line VI—VI in FIG. 5.

FIG. 5 is a plan view showing matrix terminals at the peripheral portion of the base plate 10. FIG. 6 is a sectional view taken on the line VI—VI in FIG. 5. A line connection land 29L is formed integrally with one end portion of each of storage capacitance lines 29 extending from a display area 100. The gate insulating film 25 and the insulating layer 12 are selectively etched to form a window 28 through which each line connection land 29L is exposed. Near or over the array of such line connection lands 29L there is formed on the insulating layer 12 a capacitance connection land 32L of the same material as that of the data line 11. The capacitance connection land 32L is connected via a wire 32W to an external connection terminal 32X formed integrally with the wire 32W at one marginal portion of the base plate 10. A connection line 31, which extends on the gate insulating film 25 and joins the line connection lands 29L and the capacitance connection land 32L, is formed of the same material as that of the gate lines 13 and simultaneously therewith; all the storage capacitance lines 29 are connected at the line connection lands 29L to the connection line 31, and consequently, they are connected via the line connection lands 29L and the wire 32W to the external connection terminal 32X. The data lines 11 extended out from the display area 100 are connected to external connection terminals 11X which are arranged on the insulating layer 12 along one marginal side of the base plate 10 in side-by-side relation to one another and to the terminal 32X, the terminals 11X being formed of the same material as that of the data lines 11. The gate insulating film 25 has windows 11A and 32A through which the external connection terminals 11X and 32X are exposed. Outside of the display area 100 there are formed an array of line connection lands 33L corresponding to the gate lines 13, the line connection lands 33L being made of the same material as that of the data lines 11. The line connection lands 33L are extended to form gate line external connection terminals 33X arranged along the marginal edge of another side of the base plate 10. The gate insulating film 25 has windows 33H and 33A to expose therethrough the line connection lands 33L and the external connection terminals 33X, respectively. The gate lines 13 extended outwardly of the display area 100 have their end portions connected to the connection lands 33L through the windows 33H corresponding thereto.

As described above, the line connection lands 29L can be formed of the same material as that of the light blocking layers 18, the storage capacitance electrodes 17 and the storage capacitance lines 29 and at the same time as the formation of them. Moreover, the external connection terminals 11X extended from the data lines 11, the line connection lands 33L connected to the gate lines 13, the external connection terminals 33X extended from the line connection lands 33L, the capacitance connection lands 32L and the external connection terminals 32X extended therefrom can be all formed on the insulating layer 12, using the same material as that of the data lines 11 and at the same time as the lines 11 are formed. They may be formed by an ITO layer or a molybdenum-base alloy layer, a lamination of each of such layers, or a combination of the laminated molybdenum-base alloy layer and an aluminum layer. The windows 27, 28, 11A, 33A and 33H can be formed simultaneously. The connection line 31 can also be formed of the same material as that of the gate lines 13 and at the same time.

With the active matrix structure described above, it is possible to effectively prevent deterioration of the display image quality, partly because the provision of the light blocking layer 18 affords substantial reduction of the leakage current which is caused by the incidence of light to the thin film transistor 20, and partly because the provision of the storage capacitance electrode 17 allows a substantial increase in the amount of charge to be stored in the pixel electrode 14. Furthermore, since the light blocking layers 18, the storage capacitance electrodes 17 and the storage capacitance lines 29 are formed by the same layer of the same material, the number of manufacturing steps is minimized, and consequently, the manufacturing costs are low. In addition, the windows 27, 28 and 32A for the connection of the individual storage capacitance lines 29 and the windows 11A, 33A and 33H for the connection of the data lines 11 and the gate lines 13 can be simultaneously formed by a parallel plate electrode dry etching process using a gas of the carbon fluoride series; this also minimizes the number of manufacturing steps involved and hence keeps down the manufacturing costs.

While in the above embodiment the light blocking layers 18, the storage capacitance electrodes 17 and the storage capacitance lines 29 are described to be formed of aluminum, they may also be formed of chromium (Cr), tantalum (Ta), titanium (Ti), copper (Cu) or silver (Ag), or a composite metal consisting principally of each of them, or their alloy, and when aluminum (Al), copper (Cu) and silver (Ag) are used, the resistance of the storage capacitance lines 29 can be reduced. Further, in the above embodiment the insulating layer 12 is described to be formed by the silicon nitride film but it may also be formed by a silicon oxide film, tantalum oxide film, or a combination thereof, and the thickness of the insulating layer 12 may also be in the range of between 100 and 1000 nm, although it is described to be 500 nm thick in the above embodiment. Although in the above embodiment the gate insulating film 25 is described to be formed by a silicon nitride film, it may also be formed by a silicon oxide film, tantalum oxide film, or a combination thereof. Moreover, the capacitance connection land 32L, the wire 32W and the external connection terminal 32X are formed by the same layers as those of the source electrodes 22, the drain electrodes 23 and the data lines 11 in the above embodiment, but they may also be formed by the same layers as those of the gate lines 13, the gate electrodes 13G and the connection line 31 or by the same layers as those of the light blocking layers 18, the storage capacitance electrodes 17, the storage capacitance lines 29 and the line connection lands 29L. In the above embodiment, though not shown, the above-mentioned active matrix structure is entirely covered with a passivation film deposited except at the marginal portions of the base plate 10 where the windows 11A, 32A and 33A for external connection are provided.

As described above, the active matrix structure according to the present invention permits a substantial reduction of the leakage currents which result from the irradiation of the thin film transistors by light and allows a substantial increase in the amount of charge which can be stored in the pixel capacitances; hence, the display image quality will not be deteriorated. In addition, the manufacturing costs of the active matrix structure are low, because the number of manufacturing steps involved is kept to a minimum. Moreover, simultaneous formation of the windows for the connection of the storage capacitance lines and the windows for the connection of the matrix lines of the thin film transistors minimizes the number of manufacturing steps involved, and hence keeps down the manufacturing costs.

In the embodiment shown in FIGS. 3 through 6, any of the storage capacitance electrodes 17, the storage capacitance lines 29, the light blocking layers 18, the data lines 11 and the gate lines 13 may be formed of aluminum (Al), tungsten (W), molybdenum (Mo), chromium (Cr), tantalum (Ta), titanium (Ti), etc. Aluminum (Al) is particularly suitable for the lines 11, 13 and 29 because it is low in electric resistance, and it is also suitable for the light blocking layers 18 because of its high reflectivity of light. However, an aluminum thin film is defective in that hillocks are readily formed on its film surface at a relatively low temperature, say, hundreds of degrees. In contrast thereto, molybdenum (Mo), though appreciably higher in its electric resistance than aluminum (Al), is a refractory metal and hence is excellent in heat resistance, and further, because of its higher workability by chemical wet etching than other refractory metals, it is employed widely as a material for an integrated circuit such as an LSI, as an electrode material for a thin film device using thin film transistors, and as a wiring material.

It is well-known in the art, however, that when a molybdenum film is deposited on a substrate by a sputtering process using ordinary argon gas, the film usually has a columnar texture which is formed perpendicularly to the substrate surface. This columnar texture provides etching anisotropy such that the rate of etching is high in the direction perpendicular to the film surface. Consequently, when the molybdenum film formed by sputtering is patterned by chemical wet etching, the columnar structure allows an exact pattern transfer and the dimensional accuracy is high accordingly, but the pattern edges become vertical and such vertical side walls often cause the breakage of wires in the upper layers and shorting of the wires owing to insufficient voltage endurance of insulating films.

Moreover, because of the columnar texture and because of loose coupling of texture boundaries owing to the low-temperature film formation by sputtering, the molybdenum film has a defect that in the course of photolithography or chemical wet etching the developer or etchant is liable to enter the film in the direction of its thickness, i.e. along the columnar texture, damaging the underlying materials. For example, in an active matrix LCD (liquid crystal display), it is desirable, for the purpose of reducing the resistance of matrix lines, to employ a laminated structure in which an aluminum film overlies the ITO film forming the transparent electrode, but direct lamination of the ITO and aluminum (Al) films poses a problem as the ITO is corroded by preferential dissolution resulting from galvanic action between the dissimilar metals. By interposing a molybdenum film between the ITO and aluminum (Al) films, the corrosion of the ITO can be avoided, but in the case of the sputtering-deposited molybdenum film of the columnar texture, the infiltration thereinto of the developer or aluminum etchant is likely to occur, and consequently, the ITO may sometimes be impaired and its corrosion cannot completely be prevented. When an aluminum-molybdenum laminated film is subjected to etching using an aluminum etchant consisting of phosphoric acid and a small amount of nitric acid added thereto, the underlying molybdenum film is side-etched at the pattern edge to form an overhang, because the etching rate of the molybdenum (Mo) is higher than the etching rate of the aluminum (Al).

As mentioned above, since the molybdenum film is of the columnar texture, the edge of its pattern becomes vertical, and as a result of this, an overlying interconnection layer may be broken or the overlying insulating film may be shorted because of its insufficient voltage endurance. Further, during chemical wet etching the etchant enters into the columnar texture boundaries of the molybdenum film and corrodes the underlying material, and the etching rate of the underlying molybdenum film is so high that an overhang is liable to be formed.

EXPERIMENT I

In the active matrix structure for a liquid crystal display element, shown in FIGS. 3 through 6, a molybdenum-chromium alloy film was formed as a metal thin film for use as each of the light blocking layers 18, the storage capacitance electrodes 17, the storage capacitance lines 29, the data lines 11 and the gate lines 13.

A molybdenum (Mo) target containing 0 to 10 wt% of chromium was fabricated by sintering, and then a film was deposited thereon by use of a DC magnetron sputtering device. The electric power for sputtering was 800 W and the pressure of argon of the atmosphere of sputtering was held at 3.0 mTorr. The film deposition rate was not dependent on the chromium (Cr) content but was equal to that in the case of pure molybdenum.

At first, the adhesion of the molybdenum-chromium alloy film to substrates were studied. The molybdenum-chromium (hereinafter expressed also by $MoCr_x$, where x indicates the composition ratio of chromium) alloy was deposited on each of glass, stainless steel and silicon (Si) substrates of 3 μm thick, without heating the substrates. The substrates were each cut by a cutter into squares and then subjected to a tape peeling test. The pure molybdenum film was easily peeled from each of the substrates, but molybdenum films containing chromium were apparently difficult to peel off. With a 0.5% chromium content, films were peeled off glass and stainless steel substrates due to poor adhesion but no peeling was observed on the silicon substrate. When the chromium content was greater than 3%, no films were peeled off any of the substrates.

Then, the patternability of the molybdenum-chromium alloy film was examined by wet etching, using an ordinary aluminum etchant containing nitric acid as in the case of pure molybdenum. Samples were formed to a thickness of 0.3 μm on substrates heated to 150° C. As a result of the observation under a scanning electron microscope (SEM), a rectangularly-sectioned pattern was formed in the case of the pure molybdenum, but etching isotropy increased with an increase in the chromium content, and with a 5% chromium content the side wall of the pattern was formed at an angle of about 45°. This configuration is disadvantageous to the fine wiring process but hardly matters in the area employing wet etching. No residues were found with respect to samples of a 10% chromium content and the etching rate remained substantially unchanged throughout this range of composition. That is, it was found that the molybdenum-chromium alloy film could be patterned by the wet etching process using the aluminum etchant, in the same manner as is the case with the pure molybdenum film.

Figure 7:
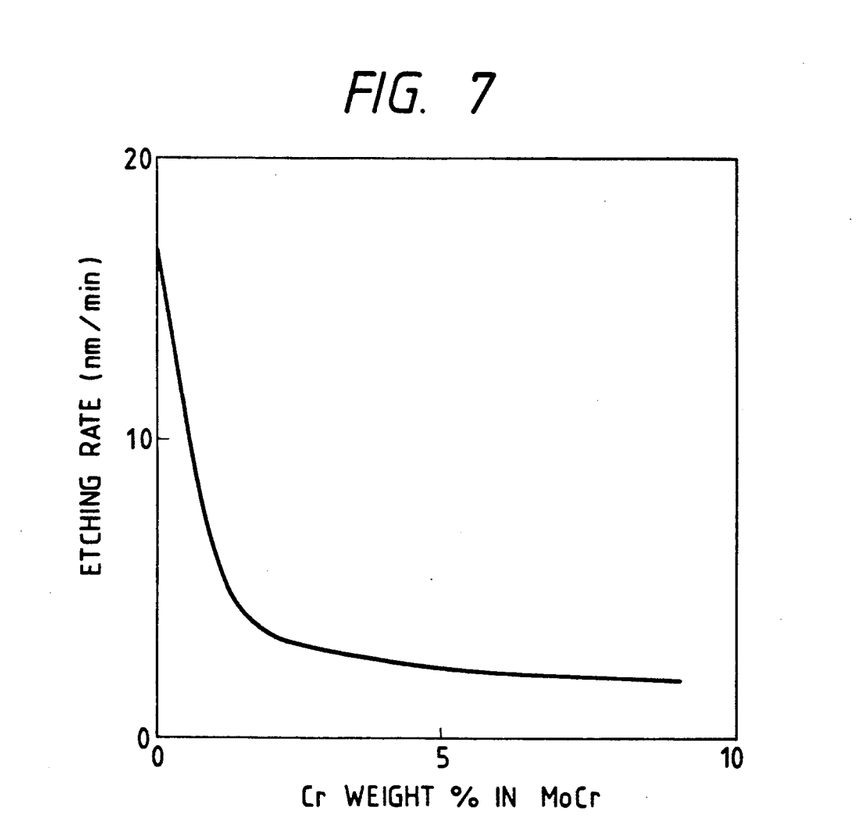
FIG. 7 is a graph showing the etching rate of a molybdenum-chromium alloy film.

On the other hand, in the case of dry etching, the chromium contained in the molybdenum-base alloy film markedly improves its resistance to gases of fluorine series such as $CF_4$. FIG. 7 shows an example, where the abscissa represents the chromium content (in wt%) in the molybdenum-base alloy and the ordinate represents the etching rate (in nm/min). As shown, an increase in the chromium content decreases the etching rate down to about ¼ that of the pure molybdenum film. Taking into account the selection ratio of chromium to other materials, patterning by the etching gases of this series is virtually impossible. Conversely, if the above-mentioned etching gas is used to selectively remove the insulating film to form the windows, the attack of the molybdenum wiring pattern containing chromium, by the etching gas, can be suppressed very small. On the other hand, in the case of employing a chlorine-series gas containing oxygen, the etching rate also somewhat decreases, as compared with that of the pure molybdenum film, owing to the chromium contained, but the decrease in the etching rate in this case is not as marked as in the case of using the $CF_4$-series gas. Accordingly, the chlorine-series gas can be used for patterning, and in the present inventors' experiments it did not present any problem in the fine wiring process. That is, by switching between two etching gas supply systems, dry etching of the film can be performed or conversely, its etching resistance can also be improved. In etching by a simple oxygen plasma, the degree of oxidation was lower, owing to the chromium contained, than in the case of the pure molybdenum film, that is, the oxidation resistance of the molybdenum-chromium alloy film was improved.

The electric resistance of the molybdenum-chromium alloy film increases monotonously with an increase in the chromium content. The pure molybdenum film produced under the above-mentioned conditions has a resistivity of about 10 to 15 $\mu\Omega\cdot cm$, but when the chromium content is 5%, the resistivity is 30 $\mu\Omega\cdot cm$ and when the chromium content is 10%, the resistivity is around 40 $\mu\Omega\cdot cm$, which is substantially equal to the resistivities of chromium and tantalum wires. This eliminates the merits of molybdenum as a wiring material and therefore the chromium content should preferably be held under 10%.

As will be appreciated from the above, the molybdenum-base alloy thin film containing 0.5 to 10 wt% of chromium is a desirable material for the lines 11, 13 and 29 or the light blocking layers 18 and the storage capacitance electrodes 17 in the liquid crystal display element. The resistance of each line 11, 13, 29 can be further reduced when it is formed by laminating such a molybdenum-base alloy layer and an ITO layer.

EXPERIMENT II

As liquid crystal display panels become wide and high-precision, the electric resistance of matrix line wirings begins to exert a serious influence on the uniformity of display characteristics of their display screens. For example, when the matrix line wiring material has a resistivity in the range of 10 to 20 $\mu\Omega\cdot cm$, the size of a panel on which a display of satisfactory image quality can be provided is about 10 inches at the largest.

It is desirable, therefore, that aluminum of low electric resistance be used as a wiring material of the active matrix structure. However, an aluminum thin film is poor in heat resistance as referred to previously, and when it is heated at about 250° C., the aluminum surface becomes roughened and the aforementioned hillock effect is liable to occur. Accordingly, when aluminum is used as the underlayer wiring material, limitations on the manufacturing process become severe. Moreover, when the aluminum layer is formed in direct contact with the ITO layer that forms the transparent conductive film, the chemical resistance of the ITO is impaired by the electrochemical effect mentioned previously. At the same time, the electrical contact of the aluminum with the ITO is poor and the contact resistance becomes deteriorated with the lapse of time. To avoid these problems, when the aluminum layer is formed as the underlying metal layer, its surface is covered with the aforementioned $MoCr_x$ thin film, and when the ITO layer and the aluminum layer are laminated, a $MoCr_x$ layer is interposed between them.

It has been found that the above-mentioned $MoCr_x$ thin film added with 0.5 to 10 wt% of chromium exhibits excellent adhesion to a silicon nitride film and an ITO film. It has also been found that the $MoCr_x$ thin film is easy to etch with the aluminum etchant and that the laminated film patterned by etching has gently sloping side walls toward the substrate. Thus, the aforementioned disadvantages of using aluminum in the active matrix structure can be sufficiently be compensated for by laminating the $MoCr_x$ thin film and the aluminum film.

Figure 8:
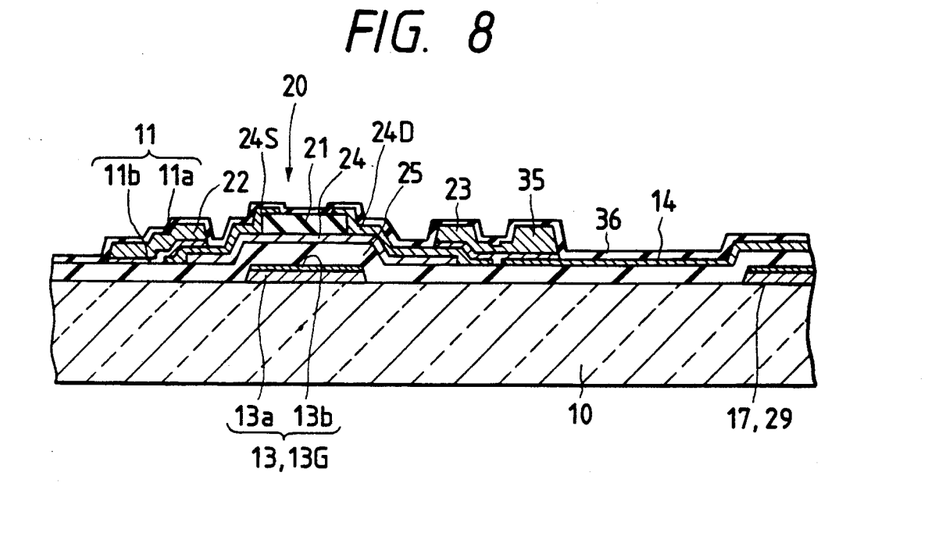
FIG. 8 is a sectional view showing one pixel and its vicinity in the active matrix structure employing the molybdenum-chromium alloy film for wiring.

FIG. 8 illustrates in section one thin film transistor and its vicinity in an active matrix structure in which the gate line 13 and the data line 11 are formed by laminating $MoCr_x$ and aluminum layers and an inverse staggered TFT structure is employed. This active matrix structure was fabricated in the manner described below.

At first, aluminum (Al) and molybdenum (Mo) added with 1 wt% of chromium (Cr) were deposited, in succession, to thicknesses of 1 $\mu m$ and 0.05 $\mu m$ on a glass substrate 10, respectively. After the formation of a photoresist pattern the laminated film was selectively etched away using an ordinary aluminum etchant, i.e. a phosphoric acid solution containing nitric acid, by which the gate electrodes 13G, the gate lines 13, the storage capacitance electrodes 17 and the storage capacitance lines 29 were formed. Consequently, each gate line 13 has a structure in which a $MoCr_x$ layer 13B overlies an aluminum layer 13a as depicted in FIG. 8. The gate electrodes 13G, the storage capacitance electrodes 17 and the storage capacitance lines 29 also have the same structure as that of the gate lines 13. Each gate electrode 13 functions also as a light blocking layer. The side wall of the pattern has an inclination of approximately 50 degrees and a defect in a stepped portion of a film coated on the side wall could be avoided.

Next, a silicon nitride film as the gate insulating film 25, an amorphous silicon film as a semiconductor active layer 24 and a silicon nitride film as an active layer protecting film 21 were deposited, in succession, by a plasma CVD process to form an active area. When only the aluminum layer was used, the aforementioned hillock was grown by heating of the substrate during the plasma CVD process, so that the surface of the layer was roughened, and characteristics of the thin film transistor formed on such a layer were deteriorated and the number of shorts increased remarkably. On the other hand, the above-mentioned laminated wiring layer was free from the generation of hillock and its surface remained smooth.

Next, amorphous silicon doped with phosphorus for the source 24S and the drain 24D was deposited, and after patterning of the deposited layer, ITO was deposited thereon to form the pixel electrodes 14. Further, molybdenum containing 1 wt% of chromium and aluminum were deposited to thicknesses of 0.1 μm and 0.4 μm, respectively. After the formation of a photoresist pattern, the laminated film was selectively etched away by an ordinary aluminum etchant to form a wire 34 for interconnecting the pixel electrode 14 and the drain 24D, the source and drain electrodes 22 and 23 and the data bus 11. Consequently, each data line 11 has a structure in which the aluminum layer 11a overlies the MoCr$_x$ layer 11b. The source electrode 22 formed integrally with the data line 11, the wire 35 and the drain electrode 23 formed integrally therewith also have the same structure as the data line 11. Finally, a silicon nitride film 36 was deposited as a protective film and then it was selectively removed to form windows for exposing therethrough the external connection terminals.

In the active matrix structure produced as mentioned above, the ITO layer forming the pixel electrode 14 and the drain 24D made completely ohmic contact with each other. Sheet resistances of the data line 11 and the gate line 13, calculated from their measured resistance values, were favorable, i.e. 0.4 and 0.15 Ω, respectively; in particular, the sheet resistance of the gate line 13 was one or more orders of magnitude smaller than in the cases of conventional chromium and tantalum wiring layers.

In the above experiment pure aluminum was used for the aluminum layer, but when it is required to be heat-resistant to some extent, it is also possible to use an aluminum-base alloy added with copper (Cu), titanium (Ti), silicon (Si), palladium (Pd), nickel (Ni), or magnesium (Mg) to enhance its heat resistance. While in the above experiment employed a laminated wiring structure composed of one aluminum layer and one molybdenum-chromium alloy layer, such a two-layer structure may be replaced by, for example, a three-layer structure in which an aluminum or aluminum-base alloy layer is sandwiched between molybdenum-chromium alloy layers.

Although the above experiment has been described in connection with an active matrix structure which employs the inverse staggered type thin film transistor, the invention is also applicable to an active matrix structure employing the staggered type thin film transistor. In this instance, the resistance of the underlayer data line can be decreased; namely, the data line, which is usually required to be high-speed, can be made low in resistance, and consequently, the effect by the introduction of the aluminum laminated wiring structure is especially remarkable.

EXPERIMENT III

In this experiment a molybdenum film and an aluminum film are laminated instead of using the MoCr$_x$ film in Experiment II. In this case, however, the molybdenum film is deposited using a sputtering gas mixed with nitrogen unlike in the prior art.

Figure 9:
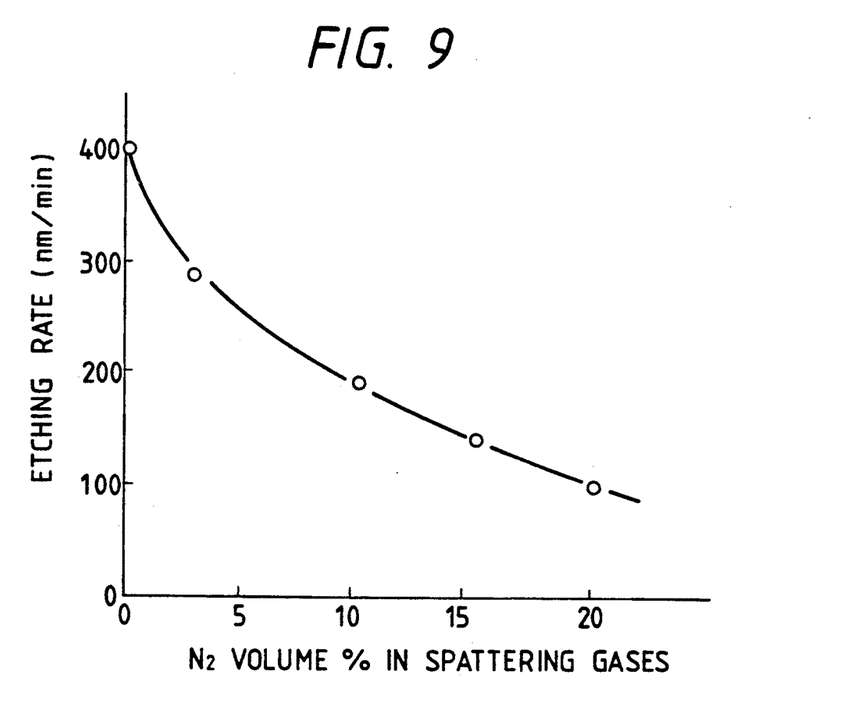
FIG. 9 is a graph showing the relationship between the concentration of nitrogen in a sputtering gas and the etching rate of a molybdenum film formed by sputtering.

In the formation of the molybdenum film, argon is usually employed as the sputtering gas, but it has been found that the etching rate of the molybdenum film decreases in the case where it is deposited using, as the sputtering gas, a mixture of argon and nitrogen. FIG. 9 shows the relationship between the nitrogen mixing ratio and the etching rate. When nitrogen is mixed 20% by volume, the etching rate of the molybdenum film by an ordinary aluminum etchant, which consists principally of phosphoric acid, is ¼ of the etching rate in the case of argon 100%.

On the other hand, the inclination of the side wall of the pattern edge, which was close to 90 degrees after etching, decreases with an increase in the nitrogen mixing ratio, and with the 20% nitrogen mixing ratio the inclination angle did not become 45 degrees obtainable with isotropic etching but became approximately 50 degrees.

The above-described phenomenon by mixing nitrogen into argon is considered to be caused by the fact that the presence of nitrogen in the sputtering gas promotes changing of the structure of the molybdenum film from the columnar to a homogeneous structure with an increase in the nitrogen mixing ratio, densifying the film structure.

EXAMPLE 1

ITO was deposited 500 Å thick on a glass substrate (Corning #7059) by a DC magnetron sputtering method while heating the substrate at 200° C. to obtain a sample substrate. A molybdenum film was deposited 100 nm thick on the sample substrate, using as the sputtering gas argon mixed with 10% of nitrogen (N$_2$). The sputtering device used was of the sputter-up system in which a carrier with a sample set thereon 50 mm above the target was moved. The molybdenum target was of a size measuring 5 inches (12.7 cm) by 15 inches (38.1 cm) and its purity was 99.9 wt% or higher. The sample was heated at 100° C. and the temperature was maintained during sputtering, by heating it from behind. The sputtering gas used was a mixture of argon 27SCCM (Ncm$^3$/min) and N$_2$ (3SCCM), and its pressure was 3.0 mTorr. The electric power for sputtering was 1 kW at 2.0 A and at about 500 V. Under such conditions the molybdenum film was deposited 100 nm thick when the travel speed of the substrate was 120 mm/min. Following this, aluminum was deposited 200 nm thick on the molybdenum film by use of the same sputtering device. The conditions for sputtering the aluminum film were as follows: The sputtering gas was argon 30SCCM held under a pressure of 30 mTorr, the electric power for the sputtering was 3 kW at 6.0 A, and the substrate was moved at a rate of 120 mm/min and heated at 100° C.

Under the above conditions ITO (50 nm) and molybdenum (10 nm) were deposited, in this order, on the glass wafer substrate to form a three-layer film. This structure is intended for low-resistance matrix line wiring of the liquid crystal display and is used for preventing the ITO layer from corrosion by the galvanic reaction in the case where the aluminum layer is laminated directly on the ITO layer.

To form a wiring pattern by wet etching, a positive photoresist (Shiplay, Microposite 1400-31) was coated 1.5 μm thick by use of a spinner, exposed through a mask to print thereon a predetermined wiring mask and then developed using a two-fold diluted developer (Shiplay, MF-312). This developer is an amine-series developer of appreciable alkalinity, and in the case of a molybdenum film deposited using the conventional sputtering gas composed only of argon, the underlying ITO layer is impaired by the developer. The reason for this is considered as follows: In areas where no photoresist remains, that is, in those areas except the wiring areas, the developer enters through pin holes or like defects of the aluminum deposited film and through rough portions of the aluminum film at a stepped portion, passes through the molybdenum film of the columnar structure. and reaches the underlying ITO layer, thus momentarily attacking it over wide area by the galvanic reaction between the ITO and aluminum layers.

In the molybdenum film deposited using the sputtering gas mixed with nitrogen (10% in this example) according to the present invention, no corrosion of the ITO layer occurred during development. Further, even when the molybdenum film was immersed in an undiluted original developer until the aluminum film was almost dissolved, the ITO layer was not damaged at all. This indicates that the sputtering gas mixed with nitrogen densifies the molybdenum film structure, producing a remarkable effect of preventing the corrosion of the ITO layer.

After the formation of a photoresist pattern, the substrate assembly was subjected to hard baking at 120° C. for 10 minutes and then the aluminum film and the molybdenum film were successively etched with an etchant consisting of phosphoric acid, acetic acid and nitric acid in the ratio of 20 to 3 to 1. In the case of the molybdenum film deposited using the conventional sputtering gas consisting only of argon, the ITO layer was corroded frequently also in this etching process, for the same reason as mentioned above, but in this example, the ITO layer was not impaired at all.

Figure 10:
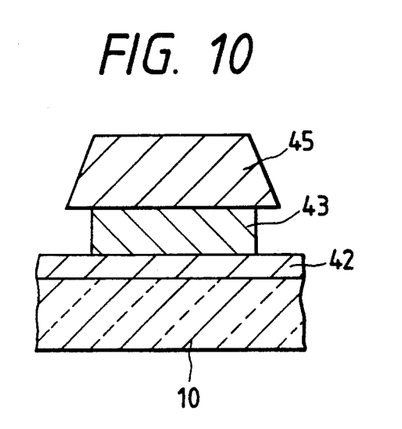
FIG. 10 is a sectional view showing an example of etching of a molybdenum-aluminum multilayer interconnection deposited by sputtering without using nitrogen.
Figure 11:
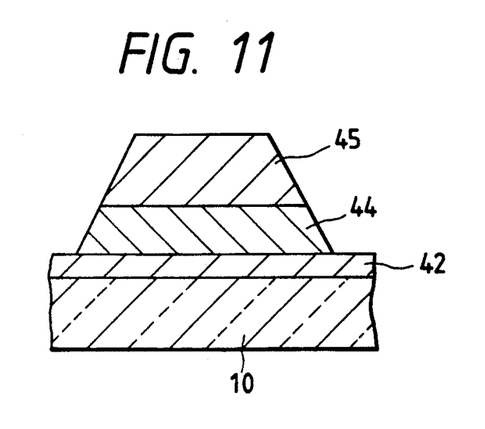
FIG. 11 is a sectional view showing an example of etching of a molybdenum-aluminum multilayer interconnection deposited by sputtering using nitrogen.

Moreover, in the case where the molybdenum film is deposited using the conventional sputtering gas consisting only of argon, it is side etched as indicated by 43 in FIG. 10, so that the overlying aluminum film 45 overhangs the molybdenum film 43 at the marginal edge of the etched pattern as shown. In the case of the molybdenum film 44 deposited using the sputtering gas mixed with 10% of nitrogen ($N_2$) according to this example, the molybdenum film 44 and the aluminum film 45 are continuously inclined to form smoothly tapered marginal edges of the etched pattern as shown in FIG. 11. This indicates that the nitrogen-mixed sputtering gas decreases the etching rate of the molybdenum film down to the vicinity of the etching rate of the aluminum film 45 and makes the molybdenum film structure homogeneous and densified. In this example, the inclination of the pattern edge was around 90 degrees partly because the nitrogen mixing ratio was 10%, but the inclination of the underlying molybdenum film 44 could be further reduced by increasing the nitrogen mixing ratio.

EXAMPLE 2

Figure 12:
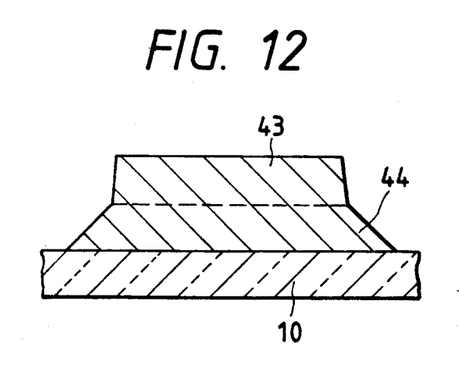
FIG. 12 is a sectional view showing an example of etching of a molybdenum multilayer interconnection deposited by sputtering using nitrogen and without using it.

Molybdenum was deposited 100 nm thick on a glass substrate (Corning, #7059), using a sputtering gas having 20% of nitrogen mixed with argon. The sputtering device used was the same as that used in Example 1. The molybdenum target was also of a size measuring 5 inches by 15 inches and its purity was also 99.9% or higher as in Example 1. The sample was heated at 100° C. and its temperature was maintained during sputtering. The sputtering gas was composed of argon 24 SCCM and nitrogen ($N_2$) 6 SCCM and its pressure was 3.0 mTorr. The electric power for the sputtering was 1 kW at 2.0 A and 500 V. The carrier travel speed was 120 mm/min. After the deposition of the molybdenum film 100 nm thick on the glass substrate, the sputtering gas was switched to a sputtering gas consisting 100% of argon and the molybdenum film was deposited another 100 nm thick under the following sputtering conditions:

The sputtering gas was composed of argon 30 SCCM, its pressure was 3.0 mTorr, and the electric power was 800 W at 2.0 A and 400 V. A predetermined wiring pattern was printed on this two-layer molybdenum film by use of a positive photoresist and then subjected to etching by an etchant consisting of phosphoric acid, acetic acid and nitric acid in the ratio of 20 to 3 to 1. The sectional configuration of the wiring pattern was observed by a scanning electron microscope. As shown in FIG. 12, the underlying molybdenum film 44 had a tapered marginal portion and the overlying molybdenum film 43 had a vertical side wall. The electric resistance of this multilayer film, converted from its sheet resistance, was $2.8 \times 10^{-5}$ $\Omega$·cm. In the case of a molybdenum single-layer film deposited using the sputtering gas containing 20% of nitrogen, the electric resistance is $7.0 \times 10^5$ $\Omega$·cm; accordingly, the resistance of the two-layer film structure is more than one-half of the resistance of the single-layer film structure.

Figure 13:
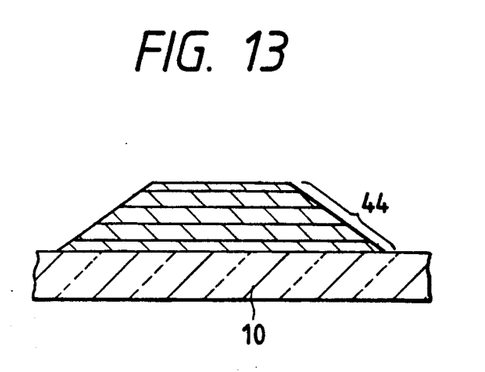
FIG. 13 is a sectional view showing an example of etching of a molybdenum film deposited by sputtering while successively changing the concentration of nitrogen.

As will be seen from the above, it is possible to taper off the marginal edges of the wiring pattern by etching while suppressing an increase in the wiring resistance by controlling the nitrogen mixing ratio of the sputtering gas. In other words, according to the present invention, the nitrogen mixing ratio of the sputtering gas is increased early in the film deposition by sputtering and then the mixing ratio is suitably decreased in accordance with the growth of the film, by which the marginal edge can be gently sloped as depicted in FIG. 13 and an increase in the wiring resistance can be suppressed. Further, by changing the nitrogen mixing ratio in three or five stages or continuously changing the mixing ratio, as required, it is possible to obtain a wiring pattern formed by the laminated molybdenum film 44 having its marginal edges gently sloped through wet etching. This effectively prevents the generation of defects of the multilayer wiring structure such as breakage of the overlying wire and a decrease in the voltage endurance of the covered insulating film.

As described above in detail, according to the present invention, a molybdenum film is deposited by sputtering by use of a sputtering gas mixed with nitrogen, and the use of such a sputtering gas makes the film structure of the molybdenum film homogeneous and dense; so that its etching rate decreases, making it possible to provide a wiring pattern structure having tapered marginal edges with high reproducibility.

By decreasing the nitrogen gas mixing ratio in accordance with the growth of the molybdenum film it is possible to reduce the angle of inclination of the tapered marginal edges of the pattern and hence prevent defects which are caused by the overlying wiring layer and a stepped portion of the insulating film.

It will be apparent that many modifications and variations may be effected without departing from the scope of the novel concepts of the present invention.

What is claimed is:

1. An active matrix structure for a liquid crystal display element, comprising:
   a transparent base plate;
   an insulating layer formed almost all over said transparent base plate;
   transparent pixel electrodes arranged in matrix form on said insulating layer;
   thin film transistors arranged in matrix form and having semiconductor layers formed on said insulating layer and drains connected to said transparent pixel electrodes, respectively;

a plurality of data lines connected respectively to sources of said thin film transistors in corresponding columns of the matrix;

a plurality of storage capacitance electrodes formed between said insulating layer and said transparent base plate to at least partly overlap corresponding ones of said transparent pixel electrodes via said insulating layer;

a plurality of light blocking layers formed between said transparent base plate and said insulating layer in opposing relation to the semiconductor layers of corresponding ones of said thin film transistors, for preventing the incidence of light on said semiconductor layers; and a plurality of storage capacitance connection lines formed between said transparent base plate and said insulating layer for interconnecting said storage capacitance electrodes;

each of said storage capacitance electrodes, capacitance connecting liens and light blocking layers being formed by conductive material layers of the same structure.

2. The active matrix structure of claim 1 wherein said thin film transistors are of the staggered type and have a common gate insulating film extending over said transparent base plate to cover said semiconductor layers of said thin film transistors, said data lines, and said transparent pixel electrodes; a plurality of gate lines formed on said common gate insulating film; said thin film transistors having gates formed on said common gate insulating film in opposing relation to said semiconductor layers of said thin film transistors, said gates on each row of said matrix being connected to a corresponding one of said gate lines.

3. The active matrix structure of claim 1 wherein said thin film transistors are of the inversely staggered type, said insulating layer acting as a common gate insulating film of all of said thin film transistors, said light blocking layers acting as the gates of said thin film transistors, said gates on each row of said matrix being connected to a corresponding one of a plurality of gate lines formed between said transparent base plate and said insulating layer.

4. The active matrix structure of claim 1 or 2, wherein said conductive material layers each include at least an aluminum layer.

5. The active matrix structure of claim 1 or 2, wherein said conductive material layers each include at least an aluminum layer and a molybdenum-base alloy layer covering said aluminum layer, said molybdenum-base alloy layer containing 0.5 to 10 wt% of chromium.

6. The active matrix structure of claim 1 or 2, wherein said conductive material layers each include at least a molybdenum-base alloy layer, said molybdenum-base alloy layer containing 0.5 to 10 wt% of chromium.

7. The active matrix structure of claim 1 or 2, wherein each of said data lines includes at least a molybdenum-base alloy layer, said molybdenum-base alloy layer containing 0.5 to 10 wt% of chromium.

8. The active matrix structure of claim 7, wherein said each data line includes an indium-tin-oxide layer laminated on said molybdenum-base alloy layer.

9. The active matrix structure of claim 8, wherein said each data line includes an aluminum layer laminated so that said molybdenum-base alloy layer is sandwiched between said aluminum layer and said indium-tin-oxide layer.

10. The active matrix structure of claim 2 or 3, wherein said each gate line includes an aluminum layer.

11. The active matrix structure of claim 2 or 3, wherein said each gate line includes at least a molybdenum-base alloy layer, said molybdenum-base alloy layer containing 0.5 to 10 wt% of chromium.

12. The active matrix structure of claim 10, wherein said each gate line includes a molybdenum-base alloy layer laminated on said aluminum layer in a manner to cover it, said molybdenum-base alloy layer containing 0.5 to 10 wt% of chromium.

13. The active matrix structure of claim 2 wherein a plurality of data line external terminals are connected to said data lines, at least one connection wiring external terminal for said capacitance connection lines and gate line external terminals for said gate lines are formed between said insulating layer and said common gate insulating film on a marginal portion of said transparent base plate, each of said gate lines being connected at one end thereof to the corresponding one of said gate line external terminals via a first window made in said common gate insulating film to expose therethrough a portion of said corresponding gate line external terminal; and wherein a connection wiring layer of the same material as that of said gate lines is formed on said common gate insulating film so as to connect a capacitance connection line and said connection wiring external terminal, respectively, through a second window passing through said common gate insulating film and said insulating layer to expose therethrough a portion of said capacitance connection line and a third window made in said common gate insulating film to expose therethrough a portion of said connection wiring external terminal.

14. An active matrix structure for a liquid crystal display element, comprising:
a transparent base plate;
transparent pixel electrodes arranged in a matrix form on said transparent base plate;
thin film transistors arranged in a matrix form and having their drains connected to said transparent pixel electrodes, respectively;
data lines each connected to sources of said thin film transistors of one column;
gate lines each connected to gates of said thin film transistors of one row; and
an insulating layer formed almost all over each of said transparent pixel electrodes in contact with of said transparent pixel electrodes;
each of said data lines including a molybdenum-base alloy layer containing 0.5 to 10 wt% of chromium.

15. The active matrix structure of claim 14, wherein said each data line includes an indium-tin-oxide layer laminated on said molybdenum-base alloy layer.

16. The active matrix structure of claim 15, wherein said each data line includes an aluminum layer laminated so that said molybdenum-base alloy layer is sandwiched between said aluminum layer and said indium-tin-oxide layer.

17. An active matrix structure for a liquid crystal display element, comprising:
a transparent base plate;
transparent pixel electrodes arranged in a matrix form on said transparent base plate;
thin film transistors arranged in a matrix form and having their drains connected to said transparent pixel electrodes, respectively;

a plurality of data lines connected respectively to sources of said thin film transistors of one column;

a plurality of gate lines connected respectively to gates of said thin film transistors of one row; and an insulating layer formed almost all over each of said transparent pixel electrodes in contact with said transparent electrodes;

each of said gate lines including at least a molybdenum-based alloy layer containing 0.5 to 10 wt% of chromium.

18. The active matrix structure of claim 17, wherein said each gate line includes an aluminum layer laminated with said molybdenum-base alloy layer.

19. An active matrix structure for a liquid crystal display element, comprising:

a transparent base plate;

a plurality of transparent pixel electrodes arranged in a matrix form on said transparent base plate;

thin film transistors arranged in a matrix form and having their drains connected to said transparent pixel electrodes, respectively;

a plurality of data lines connected respectively to sources of said thin film transistors of one column;

a plurality of gate lines connected respectively to gates of said thin film transistors of one row; and an insulating layer formed almost all over each of said transparent pixel electrodes in contact with said transparent pixel electrodes;

each of said data lines including at least a molybdenum layer having a homogeneous, densified film structure, and an aluminum layer laminated on said molybdenum layer.

20. The active matrix structure of claim 19, wherein said each data line includes an indium-tin-oxide layer laminated so that said molybdenum layer is sandwiched between said indium-tin-oxide layer and said aluminum layer.

* * * * *